May 17, 1960 H. F. JOHN 2,937,110

PROTECTIVE TREATMENT FOR SEMICONDUCTOR DEVICES

Filed July 17, 1958 6 Sheets-Sheet 1

WITNESSES

John C. Healy Jr.

Charles L. Menzemer

INVENTOR

Harold F. John

BY

Frederick Shapoe

ATTORNEY

May 17, 1960 H. F. JOHN 2,937,110

PROTECTIVE TREATMENT FOR SEMICONDUCTOR DEVICES

Filed July 17, 1958 6 Sheets-Sheet 3

PROTECTIVE TREATMENT FOR SEMICONDUCTOR DEVICES

Filed July 17, 1958 6 Sheets-Sheet 4

PROTECTIVE TREATMENT FOR SEMICONDUCTOR DEVICES

Filed July 17, 1958

May 17, 1960 H. F. JOHN 2,937,110

PROTECTIVE TREATMENT FOR SEMICONDUCTOR DEVICES

Filed July 17, 1958 6 Sheets-Sheet 6

2,937,110

PROTECTIVE TREATMENT FOR SEMICONDUCTOR DEVICES

Harold F. John, Wilkinsburg, Pa., assignor to Westinghouse Electric Corporation, East Pittsburgh, Pa., a corporation of Pennsylvania Application July 17, 1958, Serial No. 749,281

5 Claims. (Cl. 117—200)

The present invention relates to a protective treatment for semiconductor devices and has particular reference to protecting P–N and N–P junctions thereof from the reactive components of the atmosphere.

In the operation of semiconductor devices degradation of performance frequently occurs due to surface phenomena such as the presence of leakage paths on or near the surface of the body. Various explanations of these phenomena have been proposed.

Most explanations of these excess conduction and leakage phenomena involve, either singly or in various combinations, the presence of adsorbed water molecules, fixed or mobile foreign ions, and a film of germanium or silicon oxide no matter how formed. Electrolytic conduction of ions or electrolysis of water molecules either at the germanium or silicon surface, through a hydrous germanium or silicon oxide layer, or at the outer surface of the germanium or silicon oxide layer has been proposed as an explanation for certain types of surface leakage. It has also been proposed that trapping states, both at the semiconductor surface and in the oxide layer, play an important part in surface conduction and noise phenomena. The characteristics of certain charged layers on the surface, referred to as channels or inversion layers, have been extensively studied and it has been established that they can affect the electrical characteristics of P–N junction devices. One theory has proposed that an N-type surface layer can be established on Ge as, for example, on the P-type layer of an N–P–N transistor, by the adsorption of ($H^+$) ions made available by the reaction between germanium and moisture upon its surface. Furthermore, it has been proposed that providing ($O^{--}$) ions, which will react with the ($H^+$) ions and also replace them on the surface, will convert the surface from an unstable N-type to a stable P-type.

A prolonged discussion of these theories is not necessary to understand this invention and they will not be discussed further herein, except to note that it appears unlikely that all of the surface leakage problems normally encountered in both germanium and silicon P–N junction device manufactures can be ascribed to any single one or to any given combination, of the various explanations which have been offered. Also, it seems probable that channels and inversion layers can be produced by more than one set of chemical conditions on or near the surface of the semiconductor.

An object of this invention is to provide a surface protective coating for semiconductor devices comprised of a polymerizable silicone rubber and selected metal oxides distributed therein that will protect sensitive areas of the devices from the deleterious effects of moisture and the reactive constituents of the atmosphere without adversely affecting the electrical properties of the device.

Another object of this invention is to provide a combination of a thin surface protective coating for semiconductor devices and a heavy encapsulating layer of a potting resin both cooperating to provide optimum protection for the device.

Another object of this invention is to provide for semiconductor devices a surface treatment, comprising coating the surface of the device with a thin layer of a composition comprising one part by weight of a polymerizable silicone rubber and from 0.6 to 2.0 parts by weight of a selected metal oxide, that will substantially restore the electrical characteristics of devices which have been damaged by water vapor or inadequate processing during the post-etching operations.

Still another object of the present invention is to provide a process for treating the surfaces of semiconductor devices to (1) protect it from the deleterious effect of water vapor and the reactive constituents of the atmosphere; (2) enable encapsulation of the device in a potting resin; and (3) restore electrical properties of damaged devices.

Other objects will, in part, be obvious and will, in part, appear hereinafter.

In order to indicate more fully the nature and capabilities of the present invention reference is made to the following description taken in conjunction with the accompanying drawings, in which.

In accordance with the present invention and attainment of the foregoing objects there is broadly provided a protective coating for P–N junctions of a semiconductor device comprised of a selected metal oxide homogeneously dispersed throughout an elastomeric silicone resin, and more particularly comprising from 0.6 to 2 parts of the metal oxide per part of the elastomeric silicone resin.

Figure 1:
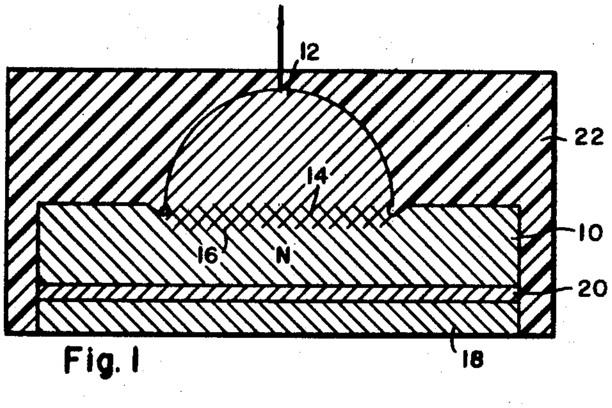
Figure 1 is a vertical cross section of a semiconductor diode embodying the teachings of this invention.

For a better understanding of the nature and objects of the invention, reference should be had to the following detailed description and drawing in which:

Figure 1 is a cross section of a semiconductor diode comprising a wafer or zone 10 of N-type material, such as germanium or silicon, onto which has been fused a pellet 12 of doping alloy, which upon cooling produces a zone 14 of recrystallized P-type material, resulting in a P–N junction 16 at the interface of the two zones. Electrical ohmic connections are made to the pellet 12 and to a metal base 18 which latter is connected to the N-type wafer 10 by a suitable ohmic solder 20. The entire device is encased by a coating 22 comprised of from 0.6 to 2.0 parts by weight of a selected metal oxide and 1 part by weight of an elastomeric silicone resin. It should be understood that more or less metal oxide may be used and that 0.6 to 2.0 parts by weight oxide represents only an optimum amount of metal oxide.

Figure 2:
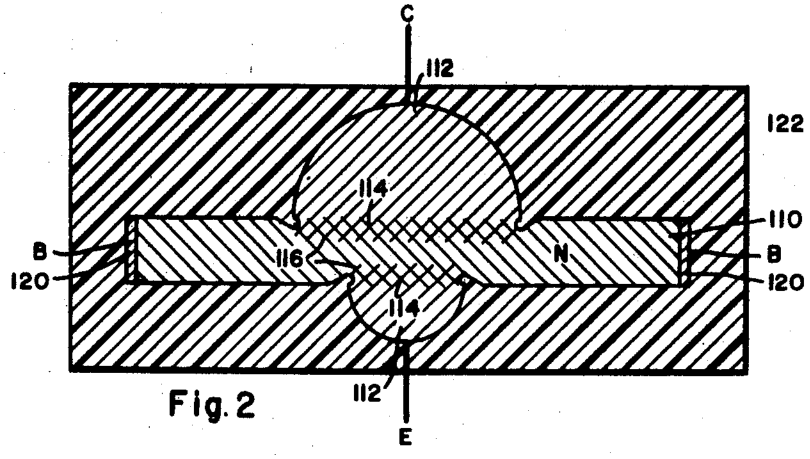
Fig. 2 is a vertical cross section of a transistor embodying the teachings of this invention.

Fig. 2 shows in cross section a P–N–P transistor prepared by fusing doping alloy pellets 112 onto an N-type wafer 110, forming P-type recrystallized regions 114, thereby giving P–N junctions 116. Ohmic connections are made to each region by electrodes termed emitter (E), collector (C), and base (B). The entire device is encased by a coating 122 comprised of from 0.6 to 2.0 parts by weight of a selected metal oxide and 1 part by weight of an elastomeric resin.

Figure 3:
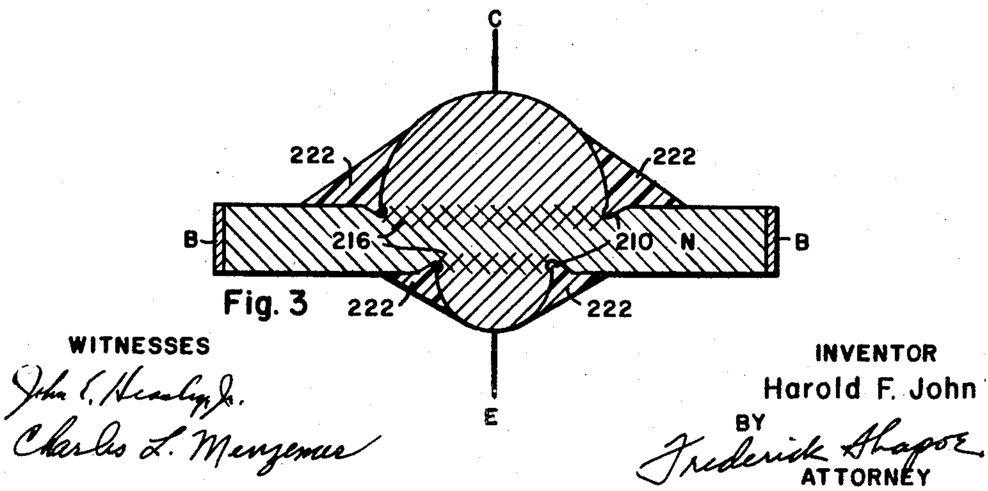
Fig. 3 is a vertical cross section of a transistor embodying the teachings of this invention in modified form.

Fig. 3 is a cross section of a semiconductive device identical to that of Fig. 2 to which the coating 222 of this invention is applied only in the vicinity of the P–N junctions 216, covering the exposed P-regions 214 and a small part of the adjacent N-regions 210. Such technique requires less coating material and leaves the electrodes free of coating for future fabrication.

The devices illustrated in Figs. 1, 2 and 3 are the alloyed junction type prepared with N-type base material; however, this should not be interpreted as limiting this invention to use with alloyed junction devices or with devices prepared on N-type base material. This invention is equally useful for protecting P–N junctions prepared on either type of base material by any of the methods known to the art, as, for example, grown P–N junctions or diffused P–N junctions as well as point contact devices.

In preparing the protective coating of this invention comprised of a selected metal oxide and an elastomeric silicone resin, the selected metal oxide employed should be nonconductive and should not react with the elastomeric silicone resin which serves as a carrier for the metal oxide. In the presence of moisture, it may be useful that the water solubility of the metal oxide be low but sufficient to provide a uniform and continuous oxidizing environment at the interface between the semiconductor and the coating. The water solubility must not be so great, however, as to give appreciable electrical leakage. This is not, however, to be taken to mean that moisture is essential to a proper conditioning of the surface. Stable surfaces of the desired potential and conductivity type can be established and maintained by selected metal oxides such as lead tetraoxide or mercuric oxide regardless of the moisture content of the ambient atmosphere. It is desirable even when the semiconductive material is confined within an atmosphere of a high degree of dryness, to provide an environment of a definite character in order to firmly fix the surface in the desired condition and thus stabilize the device characteristics.

In the utilization of this invention the selected metal oxides, selected from at least one of the group consisting of lead tetraoxide and mercuric oxide, are generally employed in the form of finely divided particles having an average particle size in the range of 1 to 5 microns admixed in an elastomeric silicone resin vehicle.

In selecting a satisfactory resin vehicle certain properties should be considered. It should adhere well to the surface of the semiconductive material, hold the metal oxide in a finely dispersed condition, have a high electrical resistance, be free of electrical conducting components after polymerization, be substantially impervious to moisture, be completely polymerizable after compounding with lead tetraoxide or mercuric oxide at a temperature low enough not to cause damage to the semiconductor device and be stable for long periods of time at the operating temperature of the device. Highly satisfactory results have been obtained from an elastomeric silicone resin.

The finely divided select metal oxide and elastomeric silicone resin, which is in the form of a thin paste or gel, may be admixed by stirring at a temperature somewhat above the melting point of the resin, or by mixing on a paint mill at a temperature either above or below the melting point of the resin.

After admixing, the coating comprising from 0.6 to 2.0 parts by weight of the metal oxide, selected from at least one of the group consisting of lead tetraoxide and mercuric oxide, and 1 part by weight of an elastomeric silicone resin, may be applied to the semiconductor device by any of the conventional ways such as dipping, brushing or spraying at a temperature providing a low viscosity or even above the melting point of the coating composition. The composition is then heated to a temperature sufficient to cure the silicone resin. A coating of from 0.5 to 2 millimeters in thickness affords the device the necessary protection, however much thicker coatings may be applied.

Further, after the protection coating has been applied and cured, the device may be encapsulated in a suitable potting resin, for example, an epoxy resin, a polyester resin, phenolic resin, silicone resin or in a hermetically sealed metal, glass or ceramic container for additional mechanical strength.

More specifically, it is desirable to employ for this invention a relatively high viscosity liquid, completely reactive organopolysiloxane which cures to an elastomer. The liquid polysiloxanes are compounds comprising essentially silicon atoms connected to each other by oxygen atoms through silicon-oxygen linkages, having an R to Si ratio of from 1.98 to 2.25:1 and have the following recurring group:

$$-\overset{\displaystyle R}{\underset{\displaystyle R}{\overset{|}{\underset{|}{Si}}}}-O-$$

where R represents monovalent organic radicals selected from the group consisting of alkyl radicals having not more than four carbon atoms and phenyl, tolyl and xylyl radicals at least 50% being alkyl groups. These liquid compositions may include some cyclic silicones.

Good results have been secured with silicones in which the majority, if not all, of the monovalent organic radicals are methyl radicals. A gum having a minor proportion of vinyl radicals, preferably present as vinylmethyl silicon-oxide groups:

$$-\overset{\displaystyle HC{=}CH_2}{\underset{\displaystyle CH_3}{\overset{|}{\underset{|}{Si}}}}-O$$

or divinyl silicon-oxide groups:

$$-\overset{\displaystyle HC{=}CH_2}{\underset{\displaystyle HC{=}CH_2}{\overset{|}{\underset{|}{Si}}}}-O-$$

gives good results.

The siloxane elastomer may be prepared by hydrolyzing a dialkyl silane or a mixture of a dialkyl and a diphenyl silane, the silanes containing an average of approximately two readily hydrolyzable groups per silicon atom. Typical readily hydrolyzable groups are halogens, for example, chlorine or fluorine, and alkoxides, for example, methoxy and ethoxy, and amino groups. While it is preferred that the alkyl groups attached to silicon be entirely methyl because of the outstanding qualities of dimethyl siloxane elastomers, other monovalent hydrocarbon groups, such as ethyl, propyl and the like may be present.

Upon hydrolysis of the dialkyl silane or mixed dialkyl silane and diaryl silane, there result oily silicone type polymers in which a majority of the units have the structure $$-O-\overset{\displaystyle R}{\underset{\displaystyle R}{\overset{|}{\underset{|}{Si}}}}-O-$$

These oily siloxane polymers, for example, a dimethyl silicone oil, may be treated with various agents to convert them to high viscosity liquid silicones. Suitable examples of such agents include ferric chloride, concentrated sulfuric acid, sulfuryl chloride, sulfuryl bromide, sulfuryl fluoride, phenyl phosphoryl dichloride and alkoxy phosphoryl dihalides. The high viscosity liquids also may be produced in other known ways, as by treating the oils with an acyl peroxide.

Acyl peroxides suitable for converting the siloxane oils, gums or gels to elastomers contain at least one aromatic acyl radical. Examples of such peroxides are benzoyl peroxide, benzoyl acetyl peroxide, dinaphthoyl peroxide, and benzoyl lauryl peroxide. The acyl radical in such peroxides may contain an inorganic substituent such, for example, as a halogen or a nitro group. The amount of acyl peroxide employed to convert a silicone liquid to an elastomer ordinarily need not exceed 10% of the weight of the silicone with 2% to 4% generally being sufficient.

A predetermined quantity of a select metal oxide, for example, lead tetraoxide or mercuric oxide, having an average particle size in the range of from 1 micron to 5 microns is added to and dispersed throughout the resin, prepared as described above. The metal oxide can be dispersed in the resin by heating the resin above its melting point or until its viscosity becomes low enough to allow ready dispersal, by first dispersing the resin in a volatile solvent, or by using a resin which has a convenient viscosity at room temperature. It is desirable to have as much metal oxide as possible present consistent, however, with maintaining a reasonable viscosity of the composition, for example, a viscosity in the range of 1 to 10,000 centipoises at 250° C. Especially satisfactory results have been obtained with mixtures comprising 0.6 to 2.0 parts by weight of metal oxide per 1 part by weight of resin.

As the metal oxide content increases, for example, when the ratio of metal oxides to resin is 1.8 to 2.0 parts by weight to 1 part by weight of resin it sometimes becomes necessary to add a solvent, for example, toluene or a silicone oil to achieve the desired viscosity. Most satisfactory results are obtained when the weight of solvent does not exceed 10% by weight of the oxide-resin composition.

When the metal oxide has been thoroughly admixed with the elastomeric silicone resin, the resultant composition may be applied to the semiconductor device by dipping, spraying or brushing. The most satisfactory method is to brush the composition onto the select area of the device a little at a time thereby affording it the opportunity to flow into and fill any tiny crevices so that no air will be trapped therein.

The entire device may be coated as shown in Fig. 1 and Fig. 2, or only a selected area at the P–N junctions as shown in Fig. 3.

The coating may be applied to any desirable thickness, however, the best results have been obtained by applying a coating having a thickness in the range of from 0.5 to 2 millimeters.

After the protective coating has been applied to the desired thickness, the metal oxide elastomeric silicone resin coating may be cured by heating it at a temperature and for a time sufficient to convert the resin to a tough elastomer. The curing temperature and time are not critical, it is usually desirable that the curing temperature be higher than the operating temperature of the semiconductor device and that the temperature and time be sufficient to completely cure the resin. It will be appreciated that room temperature vulcanizing siloxane elastomers may be employed. Heating is not required if they are used. Heating at a temperature in the range of 100° C. to 120° C. from 4 to 16 hours has been found to be satisfactory for the more common silicone elastomers applied to germanium devices, and heating to a temperature in the range of 100° C. to 200° C. for from 4 to 16 hours has been found satisfactory for silicon devices.

After the protective coating has been cured the semiconductor device may be encapsulated in a suitable resin, for example, epoxy resins, phenolic resins, polyester resins and silicone resins, or hermetically sealed into a metal, glass or ceramic container for additional mechanical strength. Excellent results have been achieved with devices prepared in accord with this invention encapsulated in an epoxy resin.

After being protected by the above explained treatment of this invention, devices can be exposed to humid air for prolonged periods without change in electric characteristics. Germanium rectifying diodes prepared in accordance with this invention have shown no change in reverse current-voltage characteristics on being kept in an environment of 80–90% relative humidity for 1½ years.

Another feature of this treatment is that it is very effective in eliminating electrical instabilities, reverse current drift, and "soft knees," which are sometimes present in the reverse current-voltage characteristics of P–N junctions after post-etching or following exposure to humid air. Unless the characteristics are very good to begin with, this treatment will cause the reverse characteristics of P–N junctions to approach more nearly the ideal flat saturation and sharp knee.

The following examples are illustrative of the practice of this invention. All quantities are expressed as parts by weight unless expressly stated to be otherwise.

*Example I*

2 parts of monochlorotrimethylsilane and 1 part of dichlorodimethylsilane were added to 4 parts of water and allowed to hydrolyze in a suitable vessel at room temperature for approximately 15 minutes. Approximately 1% by weight of resin of benzoyl peroxide was added to the polymerized mixture.

*Example II*

A series of N and P type silicon and germanium semiconductor devices were prepared as follows:

(*a*) A P–N type silicon diode was preparaed by fusing a doping pellet of aluminum onto an N-type silicon wafer. When cooled, a P–N junction existed at the interface of the N-type wafer and the aluminum alloy doping pellet. Ohmic contacts were applied to the body of the silicon wafer and the aluminum pellet.

(*b*) An N–P type silicon diode was prepared by fusing a doping pellet comprised of 99.5% by weight gold and 0.5% by weight antimony onto a P-type silicon wafer. When cooled, an N–P junction existed at the interface of the P-type wafer and the gold antimony pellet. Ohmic contacts were applied to the body of the silicon wafer and the gold antimony pellet.

(*c*) A P–N type germanium diode was prepared by fusing a doping pellet of indium onto an N-type germanium wafer. When cooled, a P–N junction existed at the interface of the N-type wafer and the indium doping pellet. Ohmic contacts were applied to the body of the germanium wafer and the indium pellet.

(*d*) An N–P type germanium diode was prepared by fusing a doping pellet comprised of 90% lead by weight and 10% antimony by weight onto a P-type germanium wafer. When cooled, an N–P junction existed at the interface of the P-type wafer and the lead-antimony doping pellet. Ohmic contacts were applied to the body of the germanium wafer and the lead antimony pellet.

*Example III*

The reverse I–V electrical characteristics of a P–N type silicon device, prepared in accordance with paragraph (*a*) of Example II, were determined by impressing a variable voltage through the device and measuring the current.

Figure 4:
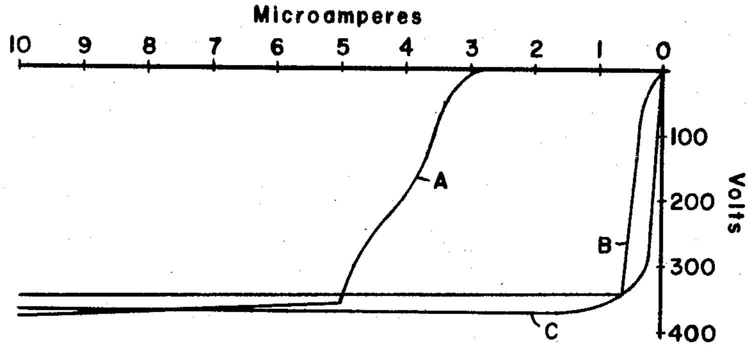
Figs. 4 to 16 are graphs plotting reverse current curves of various semiconductor devices.

The device was initially tested without coating the P–N junction and the results are shown as line A in Fig. 4.

One part of the elastomeric silicone resin of Example I was mixed at room temperature with 1.8 parts of lead tetraoxide having an average particle size in the range of 0.1 to 10 microns.

The P–N semiconductor device of this Example III was dipped into the silicone-lead tetraoxide mixture at a temperature of 20° C., whereby a coating having a thickness varying from 0.5 to 2.0 mm. was applied. It will be appreciated that the coating applied by dipping will not be uniform and will vary from spot to spot. The device was heated at a temperature of approximately 180° C. for approximately 4 hours to cure the silicone-lead tetraoxide coating.

The reverse I–V electrical characteristics of the device in the now coated state were determined and are illustrated as line B in Fig. 4.

The device was then heated to a temperature of 250° C., in air, and maintained at this elevated temperature for a period of 112 hours to determine the effect of accelerated aging on the coated device.

The reverse I–V electrical characteristics of the device were again determined and are illustrated as line C in Fig. 4.

It will be noted that the saturation curve A lacks the flatness that is characteristic of a satisfactory device. After coating, in accord with this invention, the saturation curve B of the device has now flattened out and shows a decreased leakage and improved stability over the device's uncoated characteristics. The saturation curve C indicates that the device was not adversely affected by the accelerated aging.

*Example IV*

The procedure of Example III was repeated utilizing a P–N type silicon device prepared in accordance with paragraph (*b*) of Example II.

Figure 5:
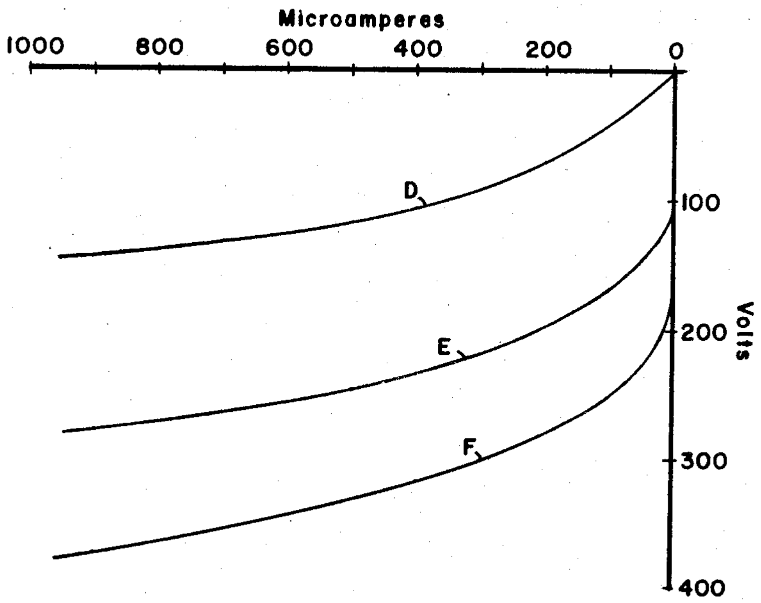

With reference to Fig. 5, it is apparent from comparison with the saturation curve D which represents the I–V reverse current characteristics of the device before coating, that these properties were improved by coating as illustrated by curve E. Curve F indicates that the I–V reverse current characteristics of the coated device were further actually improved by heating the device at 250° C. for 50 hours in a vacuum to determine the effect of aging on the device.

*Example V*

It has long been the practice in the semiconductor field to etch the semiconductor wafer after assembly to remove excess leakage paths which adversely affect the device's reverse current electrical characteristics.

A P–N silicon device was assembled in accord with paragraph (*a*) of Example II but not etched. The characteristics of the device in the unetched state were determined as in Example III and are illustrated in Fig. 6, curve G.

Figure 6:
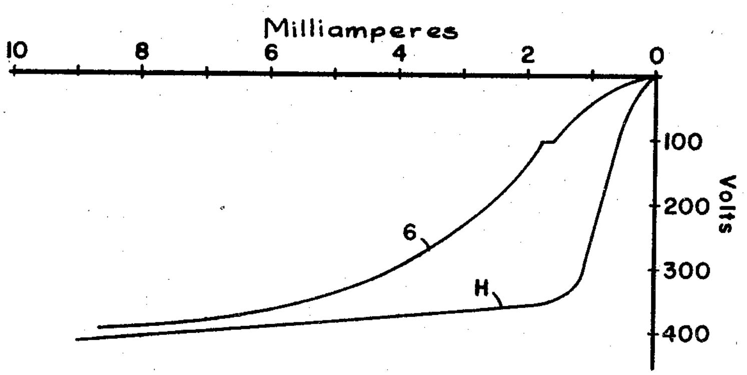

The device was coated with the silicone-lead tetraoxide mixture of Example III and its reverse current electrical characteristics again determined and illustrated in Fig. 6, curve H. It is again apparent that the reverse current characteristics have been improved by applying the coating of this invention.

*Example VI*

Figure 7:
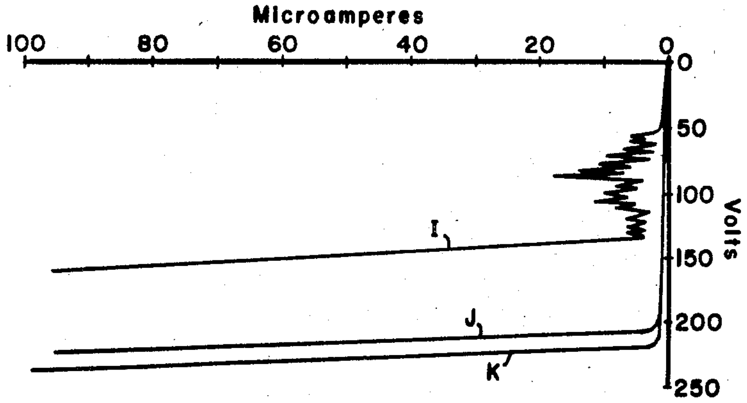

The reverse current characteristics of a P–N type semiconductor device corresponding to paragraph (*a*) of Example II were determined as described in Example III for the uncoated device and are illustrated in curve I of Fig. 7. It will be noted that considerable noise is indicated between 50 and approximately 150 volts, rendering the device unsuitable for many uses.

1.9 parts of the silicone resin of Example I was admixed with 4.75 parts of mercuric oxide having an average particle size in the range of 1 to 5 microns. The admixture was carried out at a temperature of approximately 20° C.

The device of this example was painted with a 1 mm. coating of the silicone elastomer-mercuric oxide mixture applied to the area about the N-type base, and the device was heated to and maintained at a temperature of approximately 180° C. for approximately 4 hours to cure the silicone-mercuric oxide coating. The reverse current charcteristics of the device were again determined and are illustrated in curve J of Fig. 7. It will be noted that the saturation curve has the characteristic flatness of a highly satisfactory device and it is noise-free.

The coated device of this Example VI was then subjected to accelerated aging by heating it to and maintaining it at 250° C. for 86 hours in air. The reverse current charcteristics were again determined and are illustrated in curve K of Fig. 7. It will be noted that the characteristics are substantially unchanged by the accelerated aging.

Equally satisfactory results were obtained in treating an N–P silicon type device prepared as in paragraph (*b*), Example II, with the silicone elastomer-mercuric oxide mixture of this Example VI.

*Example VII*

Figure 8:
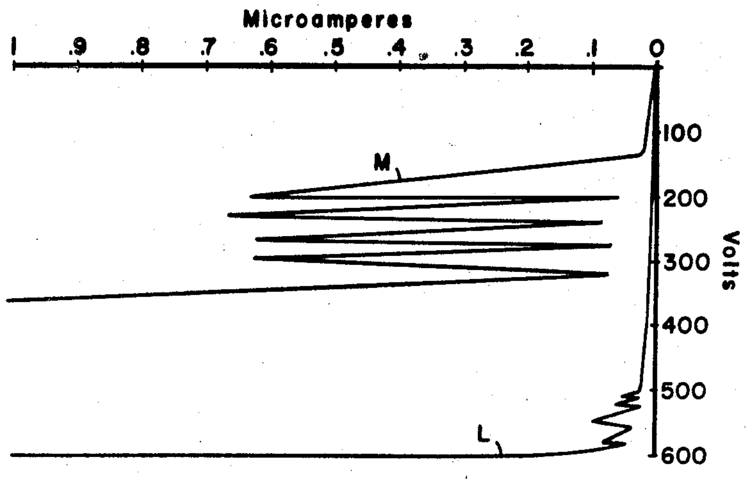

The reverse current charcteristics of an untreated P–N type silicon device constructed in accordance with (*a*) of Example II were determined in accord with the procedure of Example III and are illustrated in curve L of Fig. 8.

It will be noted that while the saturation curve exhibits the desired flatness, some noise is present between 500 and 600 volts.

A 2 mm. coating of the silicone resin of Example I was painted over the N-type base and cured by heating at 180° C. for approximately 4 hours.

The reverse current characteristics of the device were then determined as in Example III and are illustrated as curve M in Fig. 8. It will be noted that the device exhibits complete instability in the range of approximately 150 to 350 volts indicating that a coating of silicone elastomer alone does not improve the semiconductor devices.

*Example VIII*

Figure 9:
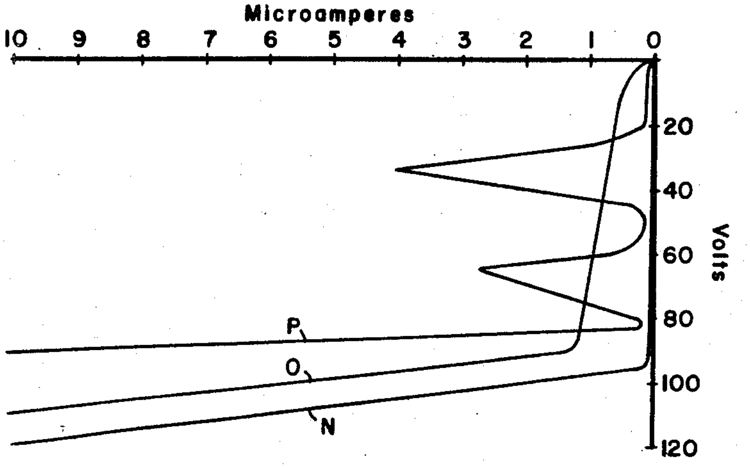

The reverse current characteristics of an untreated P–N type silicon device constructed in accordance with (*a*) of Example II, were determined as set forth in Example III and are illustrated in curve N of Fig. 9. It will be noted that the saturation curve of the device indicates a fairly satisfactory device.

1.8 parts of lead tetraoxide having an average particle size in the range of 1 to 5 microns was admixed with 1 part of a mixture comprising 7.5% by weight low molecular weight polyethylene and 92.5% by weight of polybutene. The admixture was carried out at a temperature in the range of 125° C. to 160° C.

The lead tetraoxide-polyethylene-polybutene mixture was painted about the P–N junction of the silicon semiconductor device thereby forming a coating approximately 2 mils thick, and allowed to cool.

The I–V characteristics of the device were determined and are illustrated in curve O of Fig. 9. It will be noted that leakage is experienced between approximately 20 to 90 volts.

The device then underwent accelerated aging by heating at 250° C. in a vacuum for 50 hours. The IV characteristics were again determined and are illustrated in curve P of Fig. 9. It will be noted that the device exhibited instability and was practically unsuitable for use in commercial apparatus. The polyethylene-polybutene coatings accordingly were detrimental in this instance.

Examination of other semiconductor devices coated with a polythylene-polybutene mixture indicated that the mixture slowly carbonizes when heated in a vacuum and oxidizes and/or volatilizes when heated in air and in general is not suitable for use on devices operating at high temperature.

*Example IX*

Figure 10:
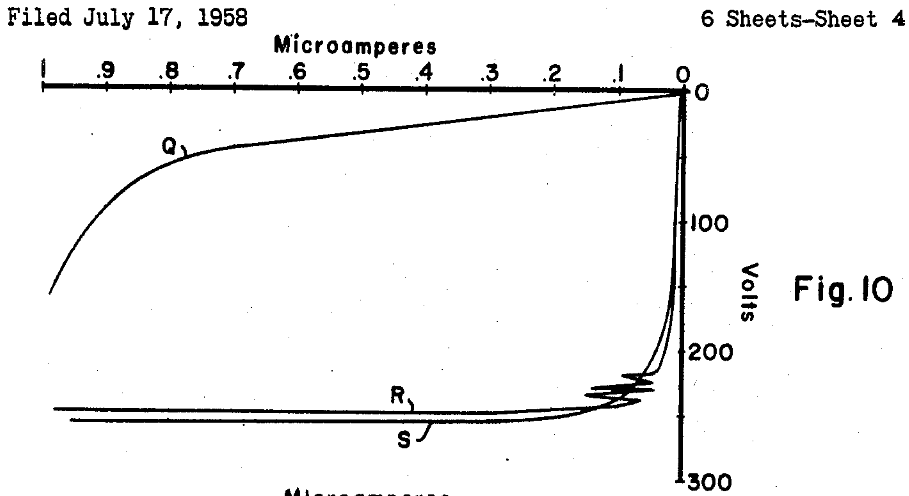

The test and treatment procedure of Example VII was applied to an uncoated and to the subsequently silicone elastomer coated P–N silicon semiconductor device constructed as paragraph (*a*) of Example II, but without accelerated aging. The coating device was allowed to remain in a normal room ambient environment for 1¾ years and its properties were remeasured. As will be noted from curve Q, Fig. 10, indicating I–V characteristics before coating, and curve R, indicating I–V characteristics after coating, the coating of this invention improved the I–V characteristics of the device. Curve S indicates that the device was not appreciably changed after exposure to room conditions for the 1¾ years.

*Example X*

The reverse I–V electrical characteristics of an untreated P–N type germanium semiconductor device constructed as in paragraph (*c*) of Example II, were determined by impressing a variable voltage through the device and measuring the current. The results of this determination are shown in curve T of Fig. 11. It will be noted that the I–V characteristics indicate a generally satisfactory device.

One part of the silicone resin of Example I was mixed with 1.8 parts of lead tetraoxide having an average particle size in the range of from 0.1 to 10 microns.

The P–N semiconductor device of this example was coated with the silicone-lead tetraoxide mixture which is at a temperature of 20° C., leaving a coating of a thickness in the range of 0.5 to 2.0 mm. The device was then heated to a temperature of 120° for 16 hours to cure the silicone-lead tetraoxide mixture.

Figure 11:
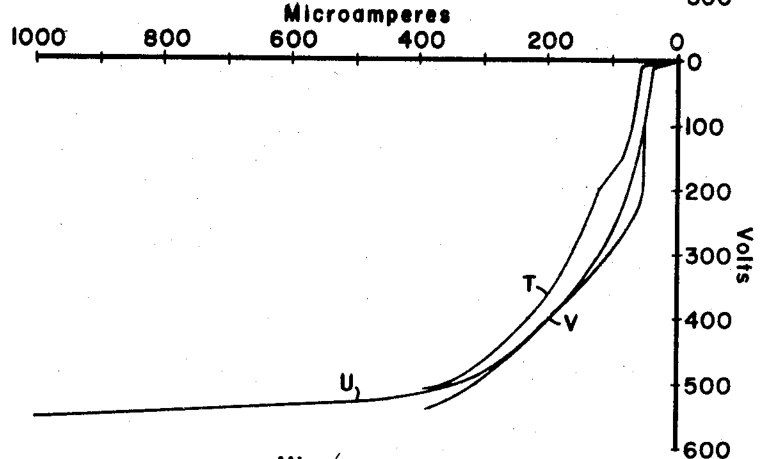

The reverse electrical characteristics were again determined and are illustrated in curve U of Fig. 11. It will be noted that the saturation current has become somewhat lower and in general is improved over that exhibited before coating.

The device was then placed in an environment of 80–90% relative humidity and it was retested after 21 months in this environment. It will be noted from curve V of Fig. 11 that no deterioration of electrical characteristics resulted from this exposure to high humidity conditions.

The same treatment when applied to an N–P type germanium semiconductor device constructed as per paragraph (*d*) of Example II gave equally satisfactory results with only a very small increase in saturation current. Protection against room ambient or high humidity conditions was equally effective.

*Example XI*

Figure 12:
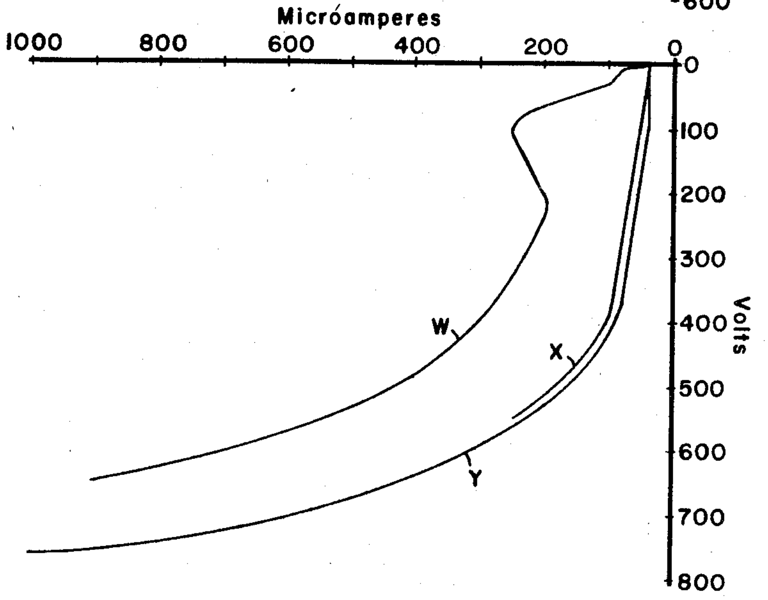

The reverse voltage characteristics of an untreated P–N germanium type semiconductor device constructed in accord with (*c*) of Example II were determined and the results plotted as curve W of Fig. 12.

One part of the elastomeric silicone resin of Example I was mixed with 0.6 part of mercuric oxide having an average particle size in the range of 1 to 5 microns.

The above P–N germanium semiconductor device was coated with the silicone-mercuric oxide mixture in a manner similar to that described in Example X, being also heated to 120° for 16 hours to cure the silicone-mercuric oxide mixture. The reverse characteristics of the coated device were determined and plotted as illustrated in curve X of Fig. 12.

It will be noted that the I–V characteristics before coating exhibited high reverse leakage, poor saturation characteristics, instability and negative resistance phenomena, and in general were unsatisfactory. After coating, the I–V characteristics were stabilized and became very good.

The coated device of this Example XI was then subjected to normal room ambient for 3 years and measured. After this time, the device was exposed to an 80–90% relative humidity environment for 50 days. As will be noted from curve Y of Fig. 12, which was prepared from this last test, there was no significant change in I–V characteristics after these conditions.

*Example XII*

A P–N type semiconductor device constructed as per paragraph (*c*) of Example II was coated with the silicone resin alone as described in Example I. The device was heated at 120° for 16 hours to cure the silicone resin.

Figure 13:
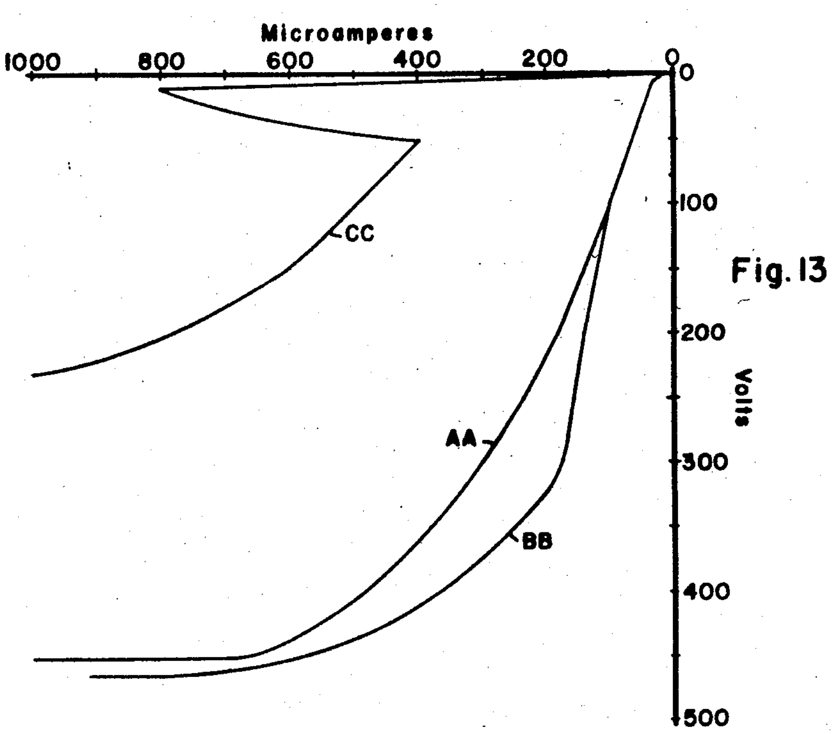

The I–V characteristics of the device before coating were measured as described in Example X, and curve AA of Fig. 13 plotted from these tests.

The I–V characteristics after applying and curing the silicone elastomer were then remeasured, indicated in curve BB of Fig. 13. It will be noted that the I–V characteristics were somewhat improved after coating, but were in general satisfactory in both instances.

The coated device was then exposed to normal room ambient conditions for 6 months and remeasured. As indicated in curve CC of Fig. 13, after only 6 months of exposure to normal room conditions, the device had become unstable and was generally quite unsatisfactory for use.

*Example XIII*

A slurry of lead tetraoxide and high purity alcohol was prepared. A P–N germanium semiconductor device prepared as per paragraph (*c*) of Example II was coated with this slurry. The methyl alcohol was allowed to evaporate, leaving a coating of 1 to 2 mm. thick of pure lead tetraoxide. The device was then heated to 115° C. for 12 hours and the I–V characteristics were measured as indicated in curve DD of Fig. 14.

Figure 14:
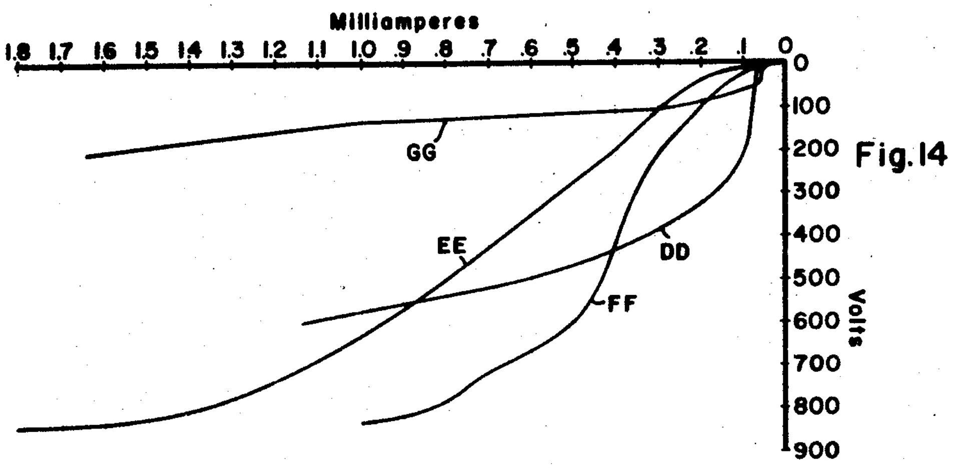

The coated device was then placed in an 80–90% relative humidity environment for 1 day and remeasured as indicated in curve EE of Fig. 14. Although the reverse leakage increased noticeably, the peak inverse voltage also increased. The device would be considered usable in some cases even though the reverse leakage is very high. When the device was exposed to 80–90% relative humidity for longer periods of time, the reverse leakage gradually decreased, as noted in curve FF of Fig. 14 after 10 days exposure to these conditions. After 20 days exposure to 80–90% relative humidity, drift and instability at high voltages were evident. By the end of 71 days considerable drift and instability were noted even at low voltages. After 92 days exposure to 80–90% relative humidity, the characteristics had deteriorated to the point where the device was no longer usable as illustrated by curve GG.

Although devices coated with pure lead tetraoxide exhibit considerably better resistance to humidity damage than devices with no treatment at all, their resistance to humidity damage compares unfavorably with devices coated with the lead tetraoxide-silicone resin described in Example X. Also devices coated as described in Example X are stable and do not show changes in I–V characteristics with time.

*Example XIV*

Figure 15:
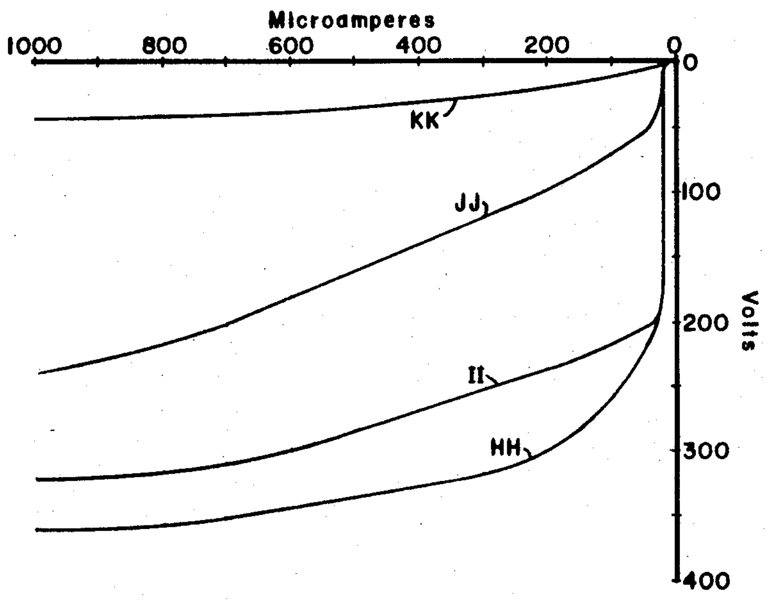

The reverse I–V characteristics of an untreated N–P germanium semiconductor device constructed as per paragraph (*d*) of Example II were measured as described in Example X with results as recorded in curve HH of Fig. 15.

A mixture containing 2.7 parts of lead tetraoxide dispersed in 1 part of a mixture of 92.5% polybutene plus 7.5% of low molecular weight polyethylene was coated onto this device to a thickness of about 2 mm. The device was then heated to 115° C. for 16 hours. The I–V characteristics were measured as indicated in curve II of Fig. 15. Although there was a slight decrease in the peak inverse voltage, the device was generally satisfactory after coating.

The device was then placed in a 80–90% relative humidity environment and remeasured after 10 days and after 21 days in this environment as indicated in curve JJ of Fig. 15. It will be noted that the I–V characteristics showed considerable deterioration after 10 days in the high humidity environment and even worse deterioration after 21 days as shown by curve KK.

Devices coated with the mixture of lead tetraoxide and polybutene-polyethylene as described above proved generally much less satisfactory in their ability to withstand high humidity conditions than devices coated with the silicone elastomer resin-lead tetraoxide mixture described in Example X. For example, one series of 9 devices coated as described in Example XIV were placed in an 80–90% relative humidity environment. Four of these devices failed in less than 11 days, 1 failed between 11 and 22 days, 3 failed between 22 and 78 days, and only 1 was still usable after 78 days. This behavior is in marked contrast to that of devices coated with the silicone elastomer-lead tetraoxide mixture described in Example X. Devices treated in the manner of Example X regularly withstand the above high humidity environment for periods greatly exceeding 1 year.

*Example XV*

A mixture of 1.8 parts of lead tetraoxide and 1 part of a mixture of polyvinylchloride and polyvinylacetate was prepared in a dispersed form by dissolving the polyvinyl chloride and polyvinyl acetate in methylethyl-ketone and mixing the lead tetraoxide into it. A P–N germanium semiconductor device constructed as per C of Example II was coated with this mixture and the methylethyl-ketone was allowed to evaporate. The device was then heated at 110° C. for 16 hours. The I–V characteristics were generally satisfactory after this treatment. This device was then placed in an 80–90% relative humidity environment. The device showed very serious deterioration by the end of 50 days in the high humidity environment, and was unsatisfactory.

*Example XVI*

Figure 16:
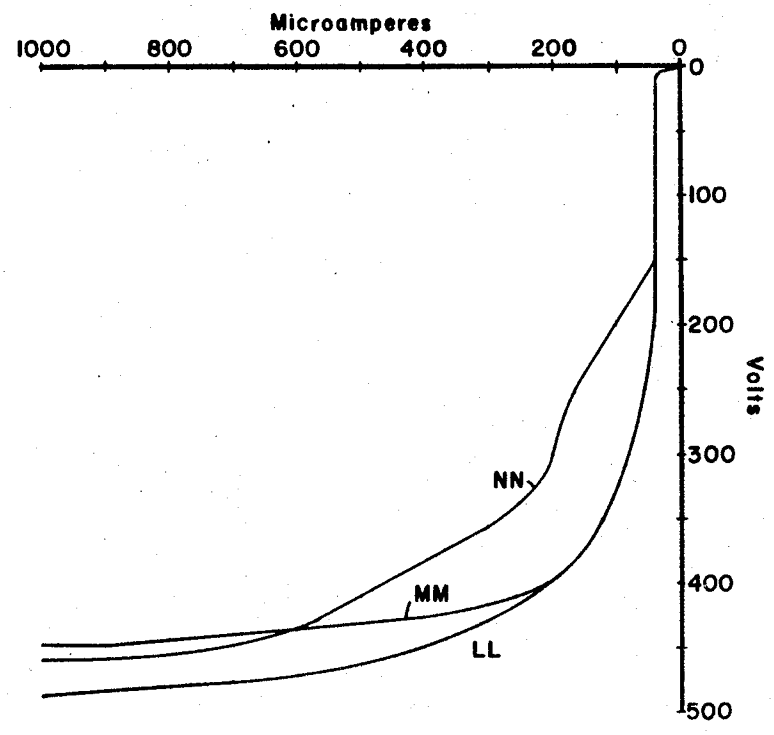

The I–V characteristics of a P–N germanium type semiconductor device prepared as per C of Example II were measured as described in Example X, and are illustrated as curve LL, Fig. 16.

A mixture was prepared containing 4.6 parts of HgO, with an average particle size in the range of 0.1 to 10 microns, dispersed in 1 part of a mixture containing 92.5% polybutene and 7.5% polyethylene. The device mentioned above was coated with this mixture to give a layer of this mixture 1 to 2 mm. thick. The coated device was then heated at 115° C. for 16 hours. The I–V characteristics were then measured as indicated by curve MM, Fig. 16. It will be noted that the I–V characteristics were quite satisfactory after coating.

The device was placed in an 80–90% relative humidity environment and remeasured after having been in this environment for 17 days. As will be noted from curve NN, Fig. 16, considerable deterioration of characteristics has occurred at voltages greater than 150 v. and it would not be expected that this particular device would remain usable for more than a few additional days in the high humidity environment.

This type of behavior is characteristic of devices coated with the mixture described in this Example XVI. In general, I–V characteristics immediately after coating with mercuric oxide-polybutene-polyethylene mixtures are satisfactory and are in general comparable in this respect to devices coated with lead tetraoxide-polybutene-polyethylene mixtures as described in Example XIV. Resistance to humidity damage of devices coated with mercuric oxide-polybutene-polyethylene mixtures is in general comparable to those coated with lead tetraoxide-polybutene-polyethylene mixtures, but much less satisfactory than the resistance to humidity damage of devices coated with mercuric oxide-silicone elastomer mixtures as described in Example XI.

*Example XVII*

A P–N–P type germanium transistor, having an Ico of 5μa. at 20 v., an Ieo of 2.5μa. at 20 v., and an α of .991, when tested in the uncoated state, was coated with a mixture consisting of 1.8 parts of lead tetraoxide and 1 part of a silicone resin as prepared in Example I, but modified with a catalyst which permitted polymerization of the silicone elastomer at room temperature.

After coating, the device was allowed to remain at room temperature until the silicone had polymerized to give an adherent, elastomeric coating around the device. A device with stable, unchanged I–V characteristics results. The device was then heated to 60° C. for 2 hours. The characteristics were remeasured. Ieo was found to be 3 μa. at 20 v., Ico was found to be 3 μa. at 20 v., and α was found to be .992. The peak inverse voltages of collector and emitter were not changed appreciably by this treatment. These and other tests indicate that a stable and humidity resistant transistor device were resulted from this treatment.

*Example XVIII*

A P–N–P type germanium transistor when tested in the uncoated state exhibited an Ico of 4.4 μa. at 20 v., an Ieo of 1.5 μa. at 20 v., a collector peak voltage of 88 v., an emitter peak voltage of 64 volts, and an α of .990. The transistor was coated with a mixture of 1 part of silicon resin as described in Example I and 1.8 parts of lead tetraoxide. After coating, the transistor was heated at 120° C. for 16 hours.

After coating and heat treatment the Ico was 6.7 μa. at 20 v., the Ieo was 4.3 μa. at 20 v., the collector peak voltage was 88 v., the emitter peak voltage was 64 v., and the α was .975. This device after treatment was stable and resistant to humidity damage.

The results obtained on the transistor described above illustrate the behavior of P–N–P germanium transistors when coated with formulations containing lead tetraoxide in silicone elastomers and cured at a temperature above 80° C. The Ico and Ieo values usually show a noticeable, but not serious, increase and the α value decreases. These effects occur, as a general rule, on any lengthy exposure of the coated device to temperatures greater than about 80° C., no matter whether such temperatures are necessary to vulcanize the silicone-lead tetraoxide mixture or whether the silicone-lead tetraoxide mixture is vulcanized at room temperature and later heated to temperatures greater than about 80° C. This type of behavior is in contrast with that of a device coated with a silicone-lead tetraoxide mixture and cured at a temperature of less than about 60° C., such as described in Example XVII.

*Example XIX*

A mixture consisting of 2.1 parts of mercuric oxide and 1 part of the silicone compound of Example I was prepared. A P–N–P germanium transistor with original values for Ico of 4.1 μa. at 20 v., and Ieo of 1.7 μa. at 20 v., a peak collector inverse voltage of 114 v., a peak emitter inverse voltage of 110 v., and an α of .990, was coated with this mixture and heated at 120° C. for 16 hours.

After this treatment, tests of the transistor shows that the Ico at 20 v. was 11 μa., the Ico at 20 v. was 3.7 μa., the peak collector inverse voltage was 122 v., the peak emitter inverse voltage was 110 v., and the α was .985. A stable and humidity resistant device resulted from the above treatment. It should be noted that the same general type of behavior resulted from treating this device with a mercuric oxide-silicone mixture as resulted from treating a similar device in Example XVIII with a lead tetraoxide-silicone mixture; namely, Ico and Ieo increased noticeably, but not seriously, and α decreased. It should further note, however, that α decreased less in the case of the device coated with the mercuric oxide-silicone resin mixture.

In summary, extensive research has shown that when a germanium semiconductor device is coated with a silicone elastomer resin-lead tetraoxide or mercuric oxide composition in accordance with the teachings of this invention, the reverse current characteristics of the device, if good before the coating is applied, are not changed. If the reverse current characteristics are not good before coating because of surface leakage they are almost always improved by the coating. Devices coated with the compositions taught in this invention have shown no change in characteristics after standing as long as three years under room ambient conditions. Other devices treated as taught in this invention have been subjected to an 85% relative humidity atmosphere for as long as 2 years without showing any deleterious changes in characteristics.

In treating silicon semiconductor devices in accordance with the teachings of this invention the following results have been achieved. Surface leakage is substantially reduced, and if the device has not been etched after treating it exhibits improved characteristics. In addition, in the latter case the slicone elastomer-lead tetraoxide or mercuric oxide composition is able to rapidly dissipate the heat resulting from such leakage currents and thereby minimize its effects upon the device. Among the benefits to be derived from the coating of N-type base silicon devices the primary ones are an improvement in the device's ability to withstand higher temperatures and higher relative humidity for extended periods of time. Among the benefits derived from the coating of P-type base silicon devices are (1) decrease or prevention of leakage currents, and (2) an improved peak inverse voltage point. When subjected to accelerated aging the test results indicate that the characteristics of the device actually in many cases improve but never are deleteriously affected by operation at high temperature and high relative humidity for extended periods of time.

The results of coating devices with a silicone elastomer resin without the lead tetraoxide or mercuric oxide additive show that while in some cases the immediate characteristics of the device sometime undergo a slight improvement, the devices do not maintain these improved characteristics over any reasonable period of time when exposed to normal room ambient conditions or to high humidity conditions.

Coating the devices with lead oxide in a polyethylene-polybutene mixture may in some cases improve the device's immediate reverse current characteristics but such devices have a very short life span especially when operated at high temperature and/or high humidity.

Since certain changes in carrying out the above processes and in the product embodying the invention may be made without departing from its scope, it is understood that the accompanying description and drawings be interpreted as illustrative and not limiting.

I claim as my invention:

1. A semiconductor device comprising a semiconductor wafer comprised of a material selected from the group consisting of silicon, germanium and silicon-germanium alloys, said wafer having at least one zone of N-type conductivity and at least one zone of P-type conductivity, and a protective coating having a minimum thickness in the range of 0.5 to 2.0 mm. disposed about and completely covering the exposed junction area between said zones of the semiconductor wafer, said coating being comprised of 1 part by weight of an elastomeric silicone resin and from about 0.6 to 2.0 parts by weight of a metal oxide, said metal oxide being selected from at least one of the group consisting of lead tetraoxide and mercuric-oxide and having an average particle size in the range of 0.1 to 10 microns, said metal oxide being dispersed homogeneously throughout the elastomeric silicone resin.

2. A semiconductor device comprising a semiconductor wafer comprised of a material selected from the group consisting of silicon, germanium and silicon-germanium alloys, said wafer having at least one zone of N-type conductivity and at least one zone of P-type conductivity and a protective coating having a minimum thickness in the range of 0.5 to 2.0 mm. disposed about and completely covering the semiconductor wafer, said coating being comprised of 1 part by weight of an elastomeric silicone resin and from about 0.6 to 2.0 parts by weight of a metal oxide, said metal oxide being selected from at least one of the group consisting of lead tetraoxide and mercuric oxide and having an average particle size in the range of 0.1 to 10 microns, said metal oxide being dispersed homogeneously throughout the elastomeric silicone resin.

3. A semiconductor device comprising a semiconductor wafer comprised of a material selected from the group consisting of silicon, germanium and silicon-germanium alloys, said wafer having at least one zone of N-type conductivity and at least one zone of P-type conductivity and a protective coating having a minimum thickness in the range of 0.5 to 2.0 mm. disposed about and completely covering the exposed junction area between said zones of the semiconductor wafer, said coating being comprised of 1 part by weight of an elastomeric silicone resin having an R to Si ratio in the range of 1.98:1 to 2.25:1, R representing monovalent organic radicals selected from the group consisting of alkyl radicals having not more than four carbon atoms and phenyl, tolyl, and xylyl radicals at least 50% being alkyl groups, and from about 0.6 to 2.0 parts by weight of a metal oxide, said metal oxide having an average particle size in the range of 0.1 to 10 microns and being selected from the group consisting of lead tetraoxide and mercuric oxide, said metal oxide being disposed homogeneously throughout the elastomeric silicon resin.

4. A semiconductor device comprising a semiconductor wafer comprised of a material selected from the group consisting of silicon, germanium and silicon-germanium alloys, said wafer having at least one zone of N-type conductivity and at least one zone of P-type conductivity and a first protective coating having a minimum thickness in the range of 0.5 to 2.0 mm. disposed about and completely covering the exposed junction area between said zones of the semiconductor wafer, said coating being comprised of 1 part by weight of an elastomeric silicon resin and from about 0.6 to 2.0 parts by weight of a metal oxide, said metal oxide being selected from at least one of the group consisting of lead tetraoxide and mercuric oxide and having an average particle size in the range of 0.1 to 10 microns, said metal oxide being dispersed homogeneously throughout the elastomeric silicone resin, and a second coating comprised of a resin selected from the group consisting of epoxy resin, phenolic resin, polyester resin and silicone resin disposed about and completely covering the semiconductor device.

5. A semiconductor device comprising a semiconductor wafer comprised of a material selected from the group consisting of silicon, germanium and silicon-germanium alloys, said wafer having at least one zone of N-type conductivity and at least one zone of P-type conductivity and a protective coating having a minimum thickness in the range of 0.5 to 2.0 mm. disposed about and completely covering the semiconductor wafer, said coating being comprised of 1 part by weight of an elastomeric silicon resin and from about 0.6 to 2.0 parts by weight of lead tetraoxide having an average particle size in the range of 0.1 to 10 microns, said lead tetraoxide being dispersed homogeneously throughout the elastomeric silicon resin.

References Cited in the file of this patent

UNITED STATES PATENTS

| | | |
|---|---|---|
| 2,438,110 | Brattain | Mar. 23, 1948 |
| 2,523,065 | Sage | Sept. 19, 1950 |
| 2,624,777 | Abbott et al. | Jan. 6, 1953 |
| 2,725,312 | Schell | Nov. 29, 1955 |